(12) United States Patent
Deeman et al.

(10) Patent No.: US 7,105,280 B1
(45) Date of Patent: Sep. 12, 2006

(54) UTILIZING PERMANENT MASTER FOR MAKING STAMPERS/IMPRINTERS FOR PATTERNING OF RECORDING MEDIA

(75) Inventors: Neil Deeman, Alamo, CA (US); Gennady Gauzner, Livermore, CA (US); Christopher Formato, Brentwood, CA (US); Nobuo Kurataka, Campbell, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 125 days.

(21) Appl. No.: 10/436,057

(22) Filed: May 13, 2003

Related U.S. Application Data

(60) Provisional application No. 60/392,907, filed on Jun. 28, 2002.

(51) Int. Cl.
*G11B 5/20* (2006.01)
(52) U.S. Cl. .................... 430/320; 430/321; 205/70; 360/16
(58) Field of Classification Search ................ 430/320, 430/321; 205/70; 360/16, 17
See application file for complete search history.

(56) References Cited

U.S. PATENT DOCUMENTS

| 4,655,878 A | * | 4/1987 | Kawai et al. ................. 216/48 |
| 6,759,183 B1 | * | 7/2004 | Nagao et al. ............... 430/320 |

2002/0051307 A1 * 5/2002 Nishikawa et al. .......... 360/17

FOREIGN PATENT DOCUMENTS

| JP | 5-205321 A | * | 8/1993 |
| JP | 10-241213 A | * | 9/1998 |
| JP | 2001-014742 A | * | 1/2004 |

* cited by examiner

*Primary Examiner*—John A. McPherson
(74) *Attorney, Agent, or Firm*—McDermott Will & Emery LLP

(57) ABSTRACT

A method of manufacturing a stamper/imprinter for use in patterning of a recording medium, comprising sequential steps of:
(a) providing a permanent master comprising a body of a substantially rigid material having a surface with a topographical pattern formed therein comprising a patterned plurality of spaced-apart recesses with a plurality of non-recessed areas therebetween, the topographical pattern corresponding to a pattern to be formed in a recording medium;
(b) forming a layer of a substantially rigid material over the surface of the permanent master with the topographical pattern formed therein;
(c) separating the layer of a substantially rigid material from the master, the layer of a substantially rigid material having an imprinting surface with a topographical pattern formed therein replicating the topographical pattern of the permanent master; and
(d) repeating steps (b) and (c) multiple times with the permanent master provided in step (a) to form a plurality of stampers/imprinters.

12 Claims, 4 Drawing Sheets

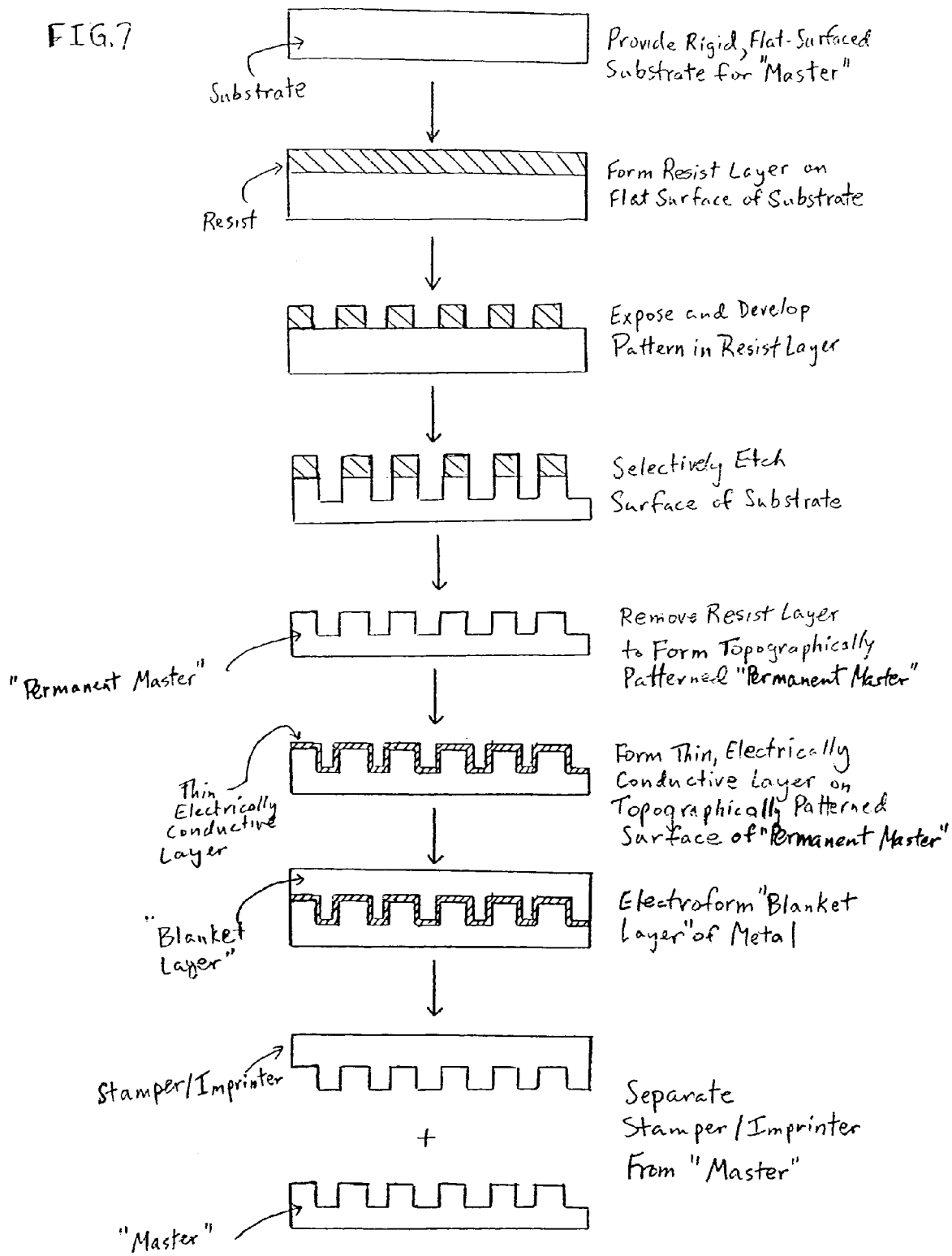

UTILIZING PERMANENT MASTER FOR MAKING STAMPERS/IMPRINTERS FOR PATTERNING OF RECORDING MEDIA

CROSS-REFERENCE TO PROVISIONAL APPLICATION

This application claims priority from U.S. provisional patent application Ser. No. 60/392,907 filed Jun. 28, 2002, the entire disclosure of which is incorporated herein by reference.

FIELD OF THE INVENTION

The present invention relates to methods for reliably manufacturing stampers/imprinters utilized for rapid, cost-effective patterning of a layer or body of a recording medium. The invention has particular utility in the formation of servo patterns in the surfaces of magnetic recording layers of magnetic data/information storage and retrieval media, e.g., hard disks.

BACKGROUND OF THE INVENTION

Recording media of various types, e.g., magnetic, optical, magneto-optical ("MO"), read-only memory ("ROM"), readable compact disks ("CD-R"), and readable-writable compact disks ("CD-RW") are widely used in various applications, e.g., in hard disk form, particularly in the computer industry for storage and retrieval of large amounts of data/information. Typically, such media types require pattern formation in the major surface(s) thereof for facilitating operation thereof. For example, magnetic and magneto-optical (MO) recording disks require formation of servo patterns for positioning the read-write transducer over a particular band or region of the media; ROM disks require formation of memory patterns therein; and CD-R and CD-RW disks require formation of wobble groove patterns therein.

Magnetic and magneto-optical (MO) recording media are conventionally fabricated in thin film form; the former are generally classified as "longitudinal" or "perpendicular", depending upon the orientation (i.e., parallel or perpendicular) of the magnetic domains of the grains of the magnetic material constituting the active magnetic recording layer, relative to the surface of the layer.

In operation of magnetic media, the magnetic layer is locally magnetized by a write transducer or write head to record and store data/information. The write transducer creates a highly concentrated magnetic field which alternates direction based on the bits of information being stored. When the local magnetic field applied by the write transducer is greater than the coercivity of the recording medium layer, then the grains of the polycrystalline magnetic layer at that location are magnetized. The grains retain their magnetization after the magnetic field applied by the write transducer is removed. The direction of the magnetization matches the direction of the applied magnetic field. The pattern of magnetization of the recording medium can subsequently produce an electrical response in a read transducer, allowing the stored medium to be read.

A typical contact start/stop (CSS) method employed during use of disk-shaped recording media, such as the above-described thin-film magnetic recording media, involves a floating transducer head gliding at a predetermined distance from the surface of the disk due to dynamic pressure effects caused by air flow generated between mutually sliding surfaces of the transducer head and the disk. During reading and recording (writing) operations, the transducer head is maintained at a controlled distance from the recording surface, supported on a bearing of air as the disk rotates, such that the transducer head is freely movable in both the circumferential and radial directions, thereby allowing data to be recorded and retrieved from the disk at a desired position in a data zone.

Adverting to FIG. 1, shown therein, in simplified, schematic plan view, is a magnetic recording disk 30 (of either longitudinal or perpendicular type) having a data zone 34 including a plurality of servo tracks, and a contact start/stop (CSS) zone 32. A servo pattern 40 is formed within the data zone 34, and includes a number of data track zones 38 separated by servo tracking zones 36. The data storage function of disk 30 is confined to the data track zones 38, while servo tracking zones 36 provide information to the disk drive which allows a read/write head to maintain alignment on the individual, tightly-spaced data tracks.

Although only a relatively few of the servo tracking zones are shown in FIG. 1 for illustrative simplicity, it should be recognized that the track patterns of the media contemplated herein may include several hundreds of servo zones to improve head tracking during each rotation of the disk. In addition, the servo tracking zones need not be straight radial zones as shown in the figure, but may instead comprise arcs, intermittent zones, or irregularly-shaped zones separating individual data tracks.

In conventional hard disk drives, data is stored in terms of bits along the data tracks. In operation, the disk is rotated at a relatively high speed, and the magnetic head assembly is mounted on the end of a support or actuator arm, which radially positions the head on the disk surface. If the actuator arm is held stationary, the magnetic head assembly will pass over a circular path on the disk, i.e., over a data track, and information can be read from or written to that track. Each concentric track has a unique radius, and reading and writing information from or to a specific track requires the magnetic head to be located above that track. By moving the actuator arm, the magnetic head assembly is moved radially on the disk surface between tracks. Many actuator arms are rotatable, wherein the magnetic head assembly is moved between tracks by activating a servomotor which pivots the actuator arm about an axis of rotation. Alternatively, a linear actuator may be used to move a magnetic head assembly radially inwardly or outwardly along a straight line.

As has been stated above, to record information on the disk, the transducer creates and applies a highly concentrated magnetic field in close proximity to the magnetic recording medium. During writing, the strength of the concentrated magnetic field directly under the write transducer is greater than the coercivity of the recording medium, and grains of the recording medium at that location are magnetized in a direction which matches the direction of the applied magnetic field. The grains of the recording medium retain their magnetization after the magnetic field is removed. As the disk rotates, the direction of the writing magnetic field is alternated, based on bits of the information being stored, thereby recording a magnetic pattern on the track directly under the write transducer.

On each track, eight "bits" typically form one "byte" and bytes of data are grouped as sectors. Reading or writing a sector requires knowledge of the physical location of the data in the data zone so that the servo-controller of the disk drive can accurately position the read/write head in the correct location at the correct time. Most disk drives use disks with embedded "servo patterns" of magnetically readable information. The servo patterns are read by the magnetic head assembly to inform the disk drive of track location. In conventional disk drives, tracks typically include both data sectors and servo patterns and each servo pattern typically includes radial indexing information, as well as a "servo burst". A servo burst is a centering pattern to precisely position the head over the center of the track. Because of the locational precision needed, writing of servo patterns requires expensive servo-pattern writing equipment and is a time consuming process.

An approach for overcoming, or at least alleviating, the above problems associated with writing of magnetic patterns in a magnetic layer, e.g., servo patterns, is disclosed in commonly assigned U.S. Pat. No. 5,991,104 to Bonyhard, the entire disclosure of which is incorporated herein by reference thereto. According to this approach, a method for forming a magnetic transition pattern, such as a servo pattern, in a layer of a magnetic material comprises steps of:

1) aligning a magnetic disk immediately adjacent a master servo-writer medium, the latter constituted of a magnetic layer having a greater agnetic coercivity than the former, wherein the servo-writer medium has a master servo pattern magnetically stored thereon which defines a plurality of concentric tracks;

2) applying a magnetic assist field to the aligned master servo-writer medium and magnetic disk, the magnetic assist field having a substantially equal magnitude at all tracks on the aligned master servo-writer medium and magnetic disk; and 3) rotating the aligned master servo-writer medium and magnetic disk relative to the magnetic assist field.

However, the above-described method incurs several drawbacks associated with its implementation in an industrially viable manner. Specifically, a "one-of-a-kind" master writer with a very high write field gradient is necessary for writing the requisite high intensity, master magnetic servo pattern onto the master disk, and a complicated means for rotating the aligned master servo-writer disk and "slave" workpiece magnetic disk is required, as is a complex system for controlling/regulating/rotating the intensity (i.e., magnitude) and directions of the magnetic assist field.

Commonly assigned, co-pending U.S. patent application Ser. No. 10/082,178, filed Feb. 26, 2002, the entire disclosure of which is incorporated herein by reference, discloses an improvement over the invention disclosed in the aforementioned commonly assigned U.S. Pat. No. 5,991,104, and is based upon the discovery that very sharply defined magnetic transition patterns can be reliably, rapidly, and cost-effectively formed in a magnetic medium containing a longitudinal or perpendicular type magnetic recording layer without requiring expensive, complicated fabrication of a master disk.

Specifically, the invention disclosed in U.S. patent application Ser. No. 10/082,178 is based upon recognition that a stamper/imprinter (analogous to the aforementioned "master") comprised of a magnetic material having a high saturation magnetization, $B_{sat}$, i.e., $B_{sat} \geq$ about 0.5 Tesla, and a high permeability, $\mu$, i.e., $\mu \geq$ about 5, e.g., selected from Ni, NiFe, CoNiFe, CoSiFe, CoFe, and CoFeV, can be effectively utilized as a contact "stamper/imprinter" for contact "imprinting" of a magnetic transition pattern, e.g., a servo pattern, in the surface of a magnetic recording layer of a magnetic medium ("workpiece"), whether of longitudinal or perpendicular type. A key feature of this invention is the use of a stamper/imprinter having an imprinting surface including a topographical pattern, i.e., comprised of projections and depressions, corresponding to a desired magnetic transition pattern, e.g., a servo pattern, to be formed in the magnetic recording layer. An advantage afforded by the invention is the ability to fabricate the topographically patterned imprinting surface of the stamper/imprinter, as well as the substrate or body therefor, of a single material, as by use of well-known and economical electro-forming techniques (described below in more detail).

According to this invention, the magnetic domains of the magnetic recording layer of the workpiece are first unidirectionally aligned (i.e., "erased" or "initialized"), as by application of a first external, unidirectional magnetic field $H_{initial}$ of first direction and high strength greater than the saturation field of the magnetic recording layer, typically $\geq 2,000$ and up to about 20,000 Oe. The imprinting surface of the stamper/imprinter is then brought into intimate (i.e., touching) contact with the surface of the magnetic recording layer. With the assistance of a second externally applied magnetic field of second, opposite direction and lower but appropriate strength $H_{re-align}$, determined by $B_{sat}/\mu$ of the stamper material (typically $\geq 100$ Oe, e.g., from about 2,000 to about 4,500 Oe), the alignment of the magnetic domains at the areas of contact between the projections of the imprinting surface of the stamper/imprinter (in the case of perpendicular recording media, as schematically illustrated in FIG. 2) or at the areas facing the depressions of the imprinting surface of the stamper/imprinter (in the case of longitudinal recording media, as schematically illustrated in FIG. 3) and the magnetic recording layer of the workpiece is selectively reversed, while the alignment of the magnetic domains at the non-contacting areas (defined by the depressions in the imprinting surface of the stamper/imprinter) or at the contacting areas, respectively, is unaffected, whereby a sharply defined magnetic transition pattern is created within the magnetic recording layer of the workpiece to be patterned which essentially mimics the topographical pattern of projections and depressions of the imprinting surface. According to the invention, high $B_{sat}$ and high $\mu$ materials are preferred for use as the stamper/imprinter in order to: (1) avoid early magnetic saturation of the stamper/imprinter at the contact points between the projections of the imprinting surface and the magnetic recording layer, and (2) provide an easy path for the magnetic flux lines which enter and/or exit at the side edges of the projections.

Another process which has been recently studied and developed as a low cost alternative technique for fine dimension pattern/feature formation in a substrate surface is thermal imprint lithography. A typical thermal imprint lithographic process for forming nano-dimensioned patterns/features in a substrate surface is illustrated with reference to the schematic, cross-sectional views of FIGS. 4(A)–4(D).

Referring to FIG. 4(A), shown therein is a stamper/imprinter 10 including a main (or support) body 12 having upper and lower opposed surfaces, with an imprinting layer 14 formed on the lower opposed surface. As illustrated, stamper/imprinter 14 includes a plurality of features 16 having a desired shape or surface contour. A workpiece 18 carrying a thin film layer 20 on an upper surface thereof is positioned below, and in facing relation to the molding layer 14. Thin film layer 20, e.g., of polymethylmethacrylate (PMMA), may be formed on the substrate/workpiece surface by any appropriate technique, e.g., spin coating.

Adverting to FIG. 4(B), shown therein is a compressive molding step, wherein stamper/imprinter 10 is pressed into the thin film layer 20 in the direction shown by arrow 22, so as to form depressed, i.e., compressed, regions 24. In the illustrated embodiment, features 16 of the imprinting layer 14 are not pressed all of the way into the thin film layer 20 and thus do not contact the surface of the underlying substrate 18. However, the top surface portions 24a of thin film 20 may contact depressed surface portions 16a of imprinting layer 14. As a consequence, the top surface portions 24a substantially conform to the shape of the depressed surface portions 16a, for example, flat. When contact between the depressed surface portions 16a of imprinting layer 14 and thin film layer 20 occurs, further movement of the imprinting layer 14 into the thin film layer 20 stops, due to the sudden increase in contact area, leading to a decrease in compressive pressure when the compressive force is constant.

FIG. 4(C) shows the cross-sectional surface contour of the thin film layer 20 following removal of stamper/imprinter 10. The imprinted thin film layer 20 includes a plurality of recesses formed at compressed regions 24 which generally conform to the shape or surface contour of features 16 of the molding layer 14. Referring to FIG. 4(D), in a next step, the surface-imprinted workpiece is subjected to processing to remove the compressed portions 24 of thin film 20 to selectively expose portions 28 of the underlying substrate 18 separated by raised features 26. Selective removal of the compressed portions 24 may be accomplished by any appropriate process, e.g., reactive ion etching (RIE) or wet chemical etching.

The above-described imprint lithographic processing is capable of providing sub-micron-dimensioned features, as by utilizing a stamper/imprinter 10 provided with patterned features 16 comprising pillars, holes, trenches, etc., by means of e-beam lithography, RIE, or other appropriate patterning method. Typical depths of features 16 range from about 5 to about 200 nm, depending upon the desired lateral dimension. The material of the imprinting layer 14 is typically selected to be hard relative to the thin film layer 20, the latter comprising a thermoplastic material which is softened when heated. Thus, suitable materials for use as the imprinting layer 14 include metals, dielectrics, semiconductors, ceramics, and composite materials. Suitable materials for use as thin film layer 20 include thermoplastic polymers which can be heated to above their glass temperature, $T_g$, such that the material exhibits low viscosity and enhanced flow.

Referring now to FIG. 5, schematically illustrated therein, in simplified cross-sectional view, is a sequence of processing steps for performing nano-imprint lithography of a metal-based workpiece, e.g., a disk-shaped substrate for a hard disk recording medium, utilizing a stamper/imprinter with a lubricated imprinting surface, as disclosed in commonly assigned, co-pending U.S. patent application Ser. No. 09/946,939, filed Sep. 6, 2001, the entire disclosure of which is incorporated herein by reference.

In a preliminary step according to the method, a thin film of a thermoplastic polymer, e.g., polymethylmethacrylate (PMMA), is spin-coated on the substrate surface. In another preliminary step, a stamper/imprinter, e.g., formed of Ni, having an imprinting surface with a negative image of servo pattern features having a lateral dimension of about 600 nm and a height of 170 nm is fabricated by conventional optical lithographic patterning/etching techniques and provided with a thin layer of an anti-sticking or release agent. In the next steps according to the disclosed invention, the system of substrate/workpiece and Ni-based stamper/imprinter is heated to above the glass transition temperature ($T_g$) of the PMMA, i.e., above about 105° C., and the negative image of the desired pattern on the imprinting surface of the stamper/imprinter is embossed into the surface of the thermoplastic PMMA layer at a pressure of about 10 MPa. The stamper/imprinter is then maintained in contact with the PMMA layer and under pressure until the system cools down to about 70° C., and then removed from the substrate/workpiece to leave replicated features of the imprinting surface in the surface of the PMMA layer. Subsequent processing of the imprinted substrate/workpiece involves selective removal of substrate material utilizing the imprinted layer of thermoplastic material as a pattern defining (etching) mask, followed by removal of the imprinted layer of thermoplastic material.

Still another process which has been recently studied and developed as a low cost alternative technique for fine dimension pattern/feature formation in a substrate surface is imprinting of a sol-gel layer on a substrate surface, as for example, disclosed in commonly assigned, co-pending U.S. patent application Ser. No. 09/852,084, filed May 10, 2001, the entire disclosure of which is incorporated herein by reference.

According to the process disclosed therein, problems attendant upon the use of very hard surfaced, high modulus materials, e.g., of glass, ceramics, or glass-ceramic composites, as substrates in the manufacture of hard disk recording media are addressed, and the invention is based upon the discovery that the surfaces of such materials may be modified, i.e., reduced in hardness, so as to facilitate formation of servo patterns therein, as by a simple and conveniently performed embossing process. According to the invention, modification (i.e., reduction) of surface hardness of high modulus substrates for use in the manufacture of thin film recording media is obtained by first forming a relatively soft sol-gel coating layer on the substrate surface, embossing the desired servo pattern in the exposed upper surface of the relatively soft sol-gel layer utilizing a stamper/imprinter with an appropriately patterned imprinting surface comprising a patterned plurality of depressions and protrusions having a negative image of the desired servo pattern, and then converting the embossed, relatively soft sol-gel layer to a relatively hard glass-like layer while retaining the embossed servo pattern therein. The thus-formed substrate with embossed servo pattern in the exposed surface thereof is then subjected to thin film deposition thereon for forming the layer stack constituting the magnetic recording medium. The inventive methodology advantageously provides servo-patterned recording media without requiring servo-writing subsequent to media fabrication.

Stampers/imprinters for use in a typical application, e.g., servo pattern formation in the recording layer of a disk-shaped, thin film, longitudinal or perpendicular magnetic recording medium comprise an imprinting surface having topographical features consisting of larger area data zones separated by smaller areas with well-defined patterns of projections and depressions corresponding to conventionally configured servo sectors, as for example, disclosed in the aforementioned commonly assigned U.S. Pat. No. 5,991,104. For example, a suitable topography for forming the servo sectors may comprise a plurality of projections having a height in the range from about 20 to about 500 nm, a width in the range from about 0.01 to about 1 μm, and a spacing of at least about 0.01 μm.

Stampers/imprinters suitable for use in performing the foregoing patterning processes may be manufactured by a sequence of steps as schematically illustrated in FIG. 6, which steps include providing a "master" comprised of a substantially rigid substrate with a patterned layer of a resist material thereon, the pattern comprising a plurality of projections and depressions corresponding (in positive or negative image form, as necessary) to the desired pattern to be formed in the surface of the stamper/imprinter. Stampers/imprinters are made from the "master" by initially forming a thin, conformal layer of an electrically conductive material over the patterned resist layer and then electroforming a substantially thicker ("blanket") metal layer on the thin layer of electrically conductive material, which electroformed blanket layer replicates the surface topography of the resist layer. Upon completion of the electroforming process, the stamper/imprinter is separated from the "master", which is then re-used for making additional stampers/imprinters.

As indicated above, processes for manufacturing stampers/imprinters for use in optical and magnetic disk pattern replication involve the transfer of a pattern in a resist layer, e.g., a rastered pattern, to the metal imprinting surface of a stamper/imprinter. However, separation of the stamper/imprinter from the mechanically fragile, patterned resist layer of the "master" frequently incurs damage to the resist surface, which damage disadvantageously results in the "master" being unusable for making additional stampers/imprinters. Thus, it is common practice to make a "family" of stampers/imprinters, i.e., wherein a first, or "father" stamper/imprinter is formed from the master and then used for making a "mother" stamper/imprinter, and then the "mother" stamper/imprinter is used for making at least one "son" stamper/imprinter. However, the additional replication steps involved in making the "family" of stampers/imprinters typically results in a loss of fidelity of the pattern which is to be replicated in the recording medium.

Another drawback/disadvantage associated with the use of a "master" comprising a patterned resist layer is that the depth of the pattern features formed in the resist layer is constrained, i.e., limited, by the process utilized for defining the pattern in the resist layer. More specifically, the thickness of the photoresist layer determines the maximum depth of the pattern features. Therefore, if deeper features are desired, resist thickness must be increased. However, such increase in resist thickness incurs a disadvantage in that an increased exposure dose is required for patterning therein, leading to an increase in the pattern recording time.

In view of the foregoing problems attendant upon the use of a conventional "master" with its mechanically fragile resist layer for pattern definition in the stamper/imprinters manufactured therefrom, there exists a need for means and methodology for manufacturing stampers/imprinters for recording media patterning which are free of the above-described problems, drawbacks, and disadvantages associated with the use of conventional "masters" for manufacture of stampers/imprinters for recording media patterning. Moreover, there exists a need for methodologies and instrumentalities which facilitate rapid, cost-effective patterning of various types of recording media, including, but not limited to, formation of servo patterns in magnetic and magneto-optical (MO) recording media.

The present invention addresses and solves the aforementioned problems, drawbacks, and disadvantages associated with the use of conventional "masters" for manufacture of stampers/imprinters for recording media patterning, while maintaining full compatibility with the requirements of automated manufacturing technology.

DISCLOSURE OF THE INVENTION

An advantage of the present invention is an improved method of manufacturing stampers/imprinters for use in patterning of various types of recording media.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of manufacturing a stamper/imprinter for use in patterning of a recording medium, comprising sequential steps of:

(a) providing a permanent master comprising a body of a substantially rigid material having a surface with a topographical pattern formed therein comprising a patterned plurality of spaced-apart recesses with a plurality of non-recessed areas therebetween, the topographical pattern corresponding to a pattern to be formed in a recording medium;

(b) forming a layer of a substantially rigid material over the surface of the permanent master with the topographical pattern formed therein; and (c) separating the layer of a substantially rigid material from the master, the layer of a substantially rigid material having an imprinting surface with a topographical pattern formed therein replicating the topographical pattern of the permanent master.

According to embodiments of the present invention, step (a) comprises providing a permanent master comprising a body of a substantially rigid material capable of undergoing planarization processing to form a substantially flat surface in which the topographical pattern is formed, e.g., a body of a material selected from the group consisting of: silicon, glass, ceramic, and glass-ceramic composites; and step (a) comprises sequential sub-steps of:

($a_1$) providing a body of a substantially rigid material having a planarized flat surface in which the topographical pattern is to be formed; the material selected from the group consisting of: silicon, glass, ceramic, and glass-ceramic composites;

($a_2$) forming a layer of a resist material on the surface of the body;

($a_3$) recording a pattern in the layer of resist corresponding to the topographical pattern to be formed in the surface of the body;

($a_4$) developing the pattern in the layer of resist to form a patterned etching mask comprising a plurality of openings exposing portions of the surface of the body corresponding to the topographical pattern to be formed therein;

($a_5$) selectively etching the exposed portions of the surface of the body utilizing the patterned etching mask to form a pattern of recesses in the flat surface of the body, the pattern of recesses corresponding to the topographical pattern; and ($a_6$) removing the patterned etching mask.

Embodiments of the invention include those where the topographical pattern corresponds to a servo pattern for a magnetic or magneto-optical (MO) recording medium, a read-only memory (ROM) pattern, or a wobble groove pattern for a readable compact disk (CD-R) or a readable-writable compact disk (CD-RW); and step (b) comprises forming a layer of a metal or metal alloy.

In accordance with particular embodiments of the present invention, step (b) comprises forming a layer of a magnetic material having high saturation magnetization $B_{sat} \geq$ about 0.5 Tesla, and high permeability $\mu \geq$ about 5, selected from the group consisting of Ni, NiFe, CoNiFe, CoSiFe, CoFe, and CoFeV.

According to embodiments of the present invention, step (b) comprises forming the layer of a substantially rigid material as a blanket layer over-filling each of the plurality of recesses and including an overburden portion extending over each of the non-recessed areas, and step (b) comprises sequential sub-steps of:

($b_1$) forming a thin layer of an electrically conductive material on the surface of the master having the topographical pattern formed therein; and ($b_2$) forming the blanket layer on the thin layer of electrically conductive material by an electrochemical process.

In accordance with particular embodiments of the present invention, step ($b_1$) comprises forming the thin layer of an electrically conductive material on the topographical pattern by means of a thin film deposition process selected from the group consisting of: electroless plating, physical vapor deposition (PVD), and chemical vapor deposition (CVD).

According to a particular embodiment of the present invention, step ($b_1$) comprises forming the layer of an electrically conductive material on the topographical pattern by means of sputtering; and step ($b_2$) comprises forming the blanket layer on the thin layer of an electrically conductive material by an electroforming process.

Further embodiments of the present invention include repeating steps (b) and (c) multiple times with the permanent master provided in step (a) to form a plurality of stampers/imprinters.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein:

FIG. 7 schematically illustrates, in simplified cross-sectional view, a sequence of steps according to the present invention, for forming a master and then forming a stamper/imprinter therefrom for use in recording media patterning.

DESCRIPTION OF THE INVENTION

Figure 1:
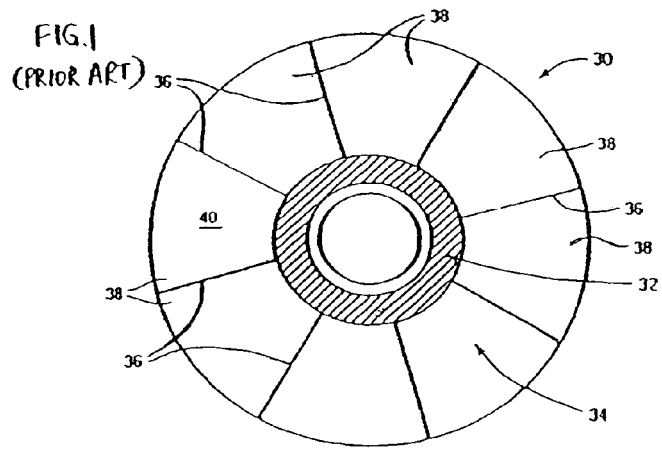
FIG. 1 illustrates in simplified, schematic plan view, a magnetic recording disk designating the data, servo pattern, and CSS zones thereof.
Figure 2:
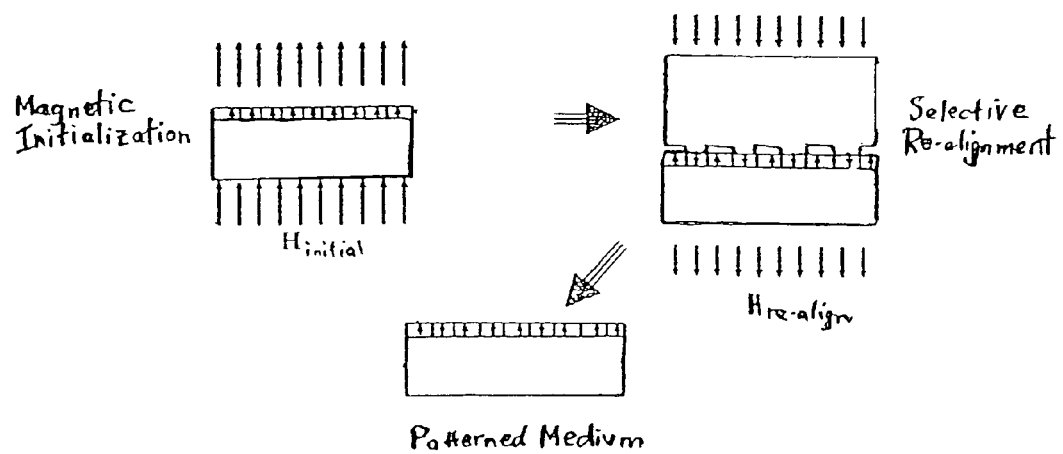
FIG. 2 illustrates, in schematic, simplified cross-sectional view, a sequence of process steps for contact printing a magnetic transition pattern in the surface of a perpendicular magnetic recording layer, utilizing a stamper/imprinter formed of a high saturation magnetization, high permeability magnetic material having an imprinting surface with a surface topography corresponding to the desired magnetic transition pattern.
Figure 3:
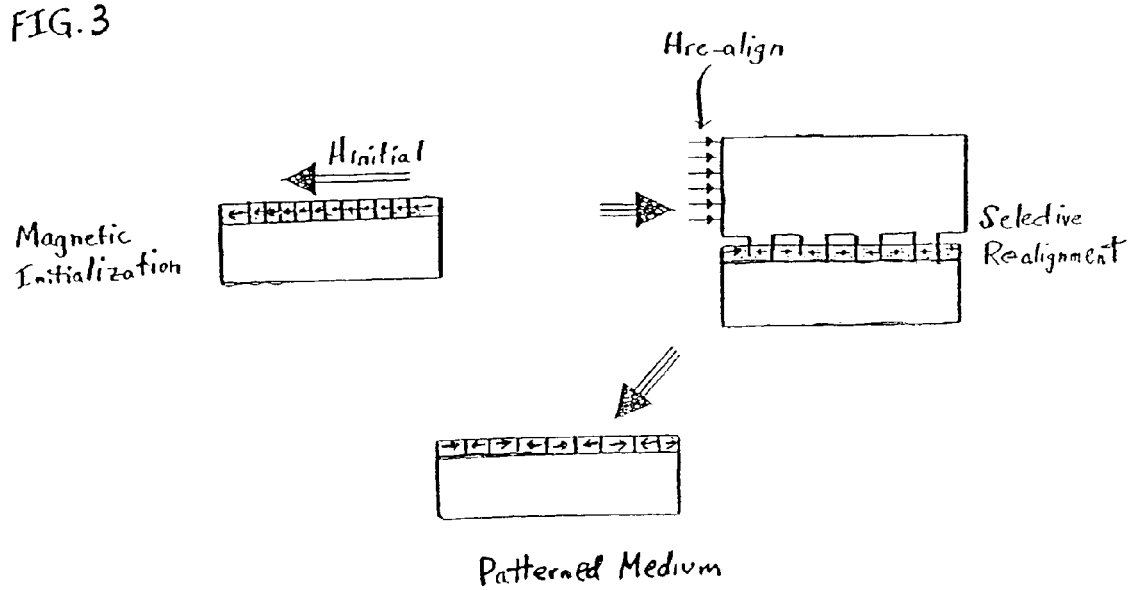
FIG. 3 illustrates, in schematic, simplified cross-sectional view, a similar sequence of process steps for contact printing a magnetic transition pattern in the surface of a longitudinal magnetic recording layer.
Figure 4A:
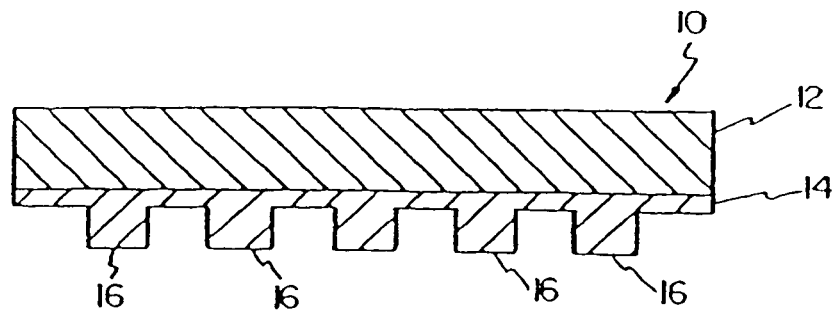
FIGS. 4(A)–4(D) illustrate, in simplified cross-sectional view, a process sequence for performing thermal imprint lithography of a thin resist film on a substrate (workpiece), according to the conventional art.
Figure 4B:
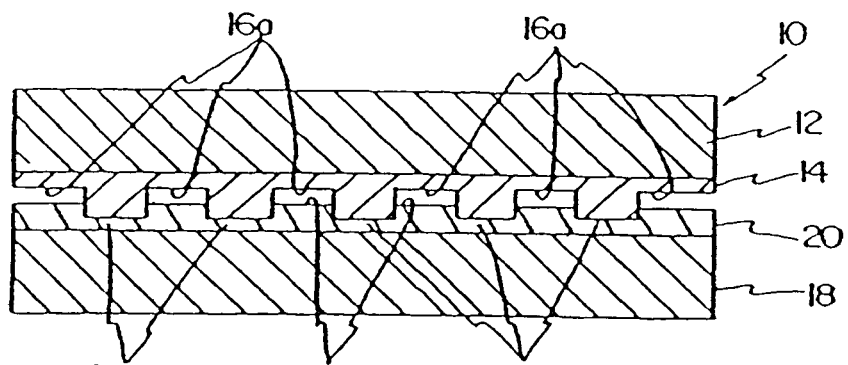
Figure 4C:
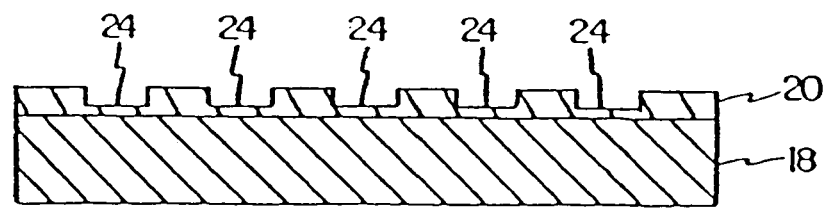
Figure 4D:
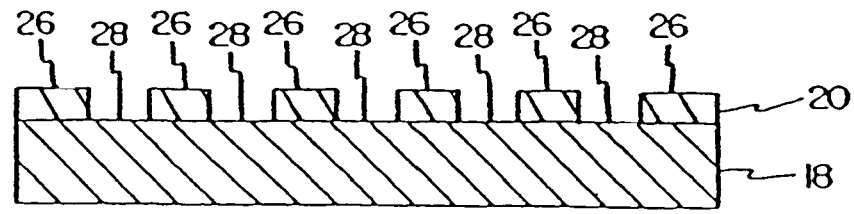
Figure 5:
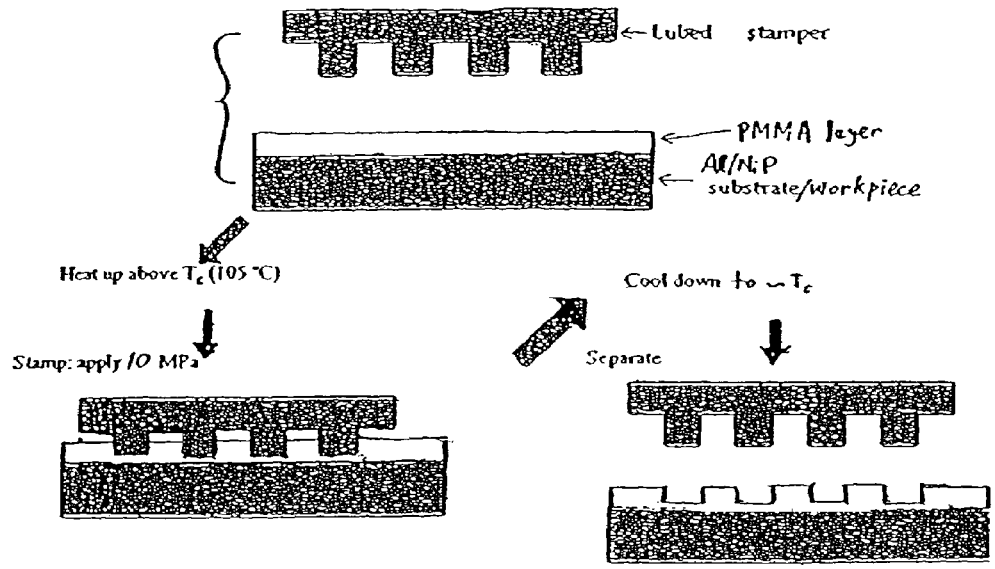
FIG. 5 schematically illustrates, in simplified cross-sectional view, another sequence of steps for performing imprint lithography of a resist film, according to the conventional art.
Figure 6:
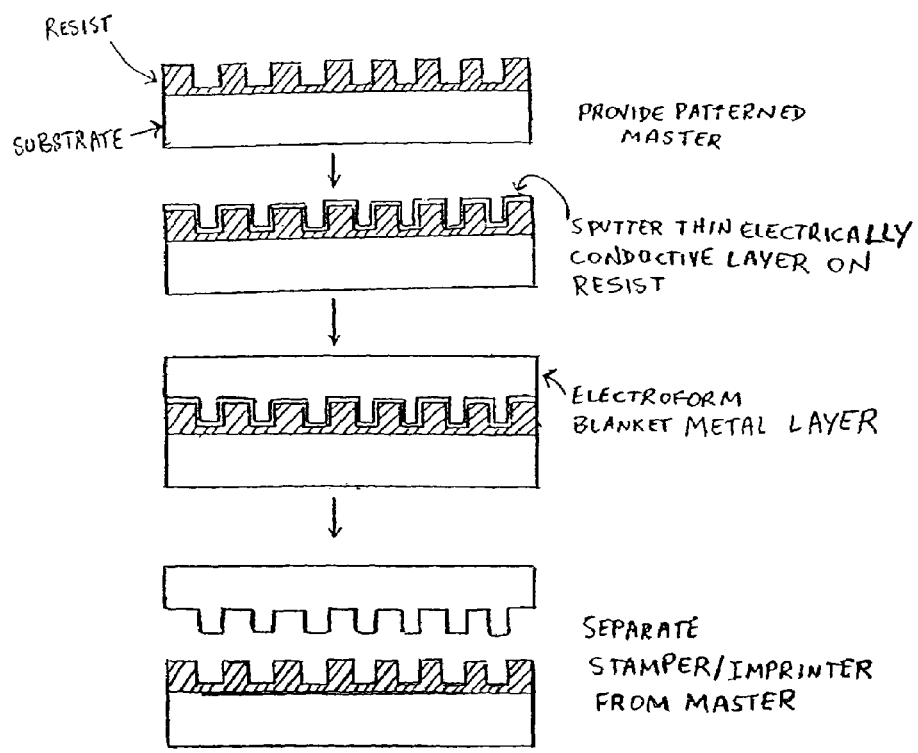
FIG. 6 schematically illustrates, in simplified cross-sectional view, a sequence of steps for forming a stamper/imprinter for recording media patterning, according to the conventional art.

The present invention addresses and solves problems and drawbacks attendant upon forming a plurality of stampers/imprinters from a "master" while maintaining replication fidelity, which stampers/imprinters are utilized for performing a variety of types of rapid, cost-efficient patterning processes in the manufacture of a variety of recording media, such as, but not limited to forming: servo patterns for magnetic or magneto-optical (MO) recording media, patterns for read-only memories (ROM), and wobble groove patterns for readable compact disks (CD-R) and readable-writable compact disks (CD-RW). Specifically, the present invention eliminates problems associated with the use of conventional "masters", wherein the pattern of topographical features which is transferred to imprinting surfaces of stampers/imprinters during manufacture of the latter is typically formed in the surface of a non-durable resist layer which is easily damaged during separation of the stamper/imprinter therefrom, resulting in a loss in pattern replication fidelity, and wherein the depth of the topographical features formed in the resist layer, e.g., by etching, is limited by virtue of the characteristics and limitations of conventional resist exposure techniques and methodologies.

Briefly stated, the present invention is based upon the discovery by the inventors that "permanent masters", i.e., "masters" wherein the topographical pattern is formed in a planarized surface of a body (substrate) of substantially rigid and mechanically durable material rather than in a mechanically fragile resist material as in conventional practice, can be utilized for forming a large plurality of stampers/imprinters therefrom without compromising replication fidelity. Further, the process by which the topographical pattern is formed in the planarized surface of the substrate of the "permanent master" facilitates etching to greater depths therein than possible with conventional resist-based "masters", thus affording greater flexibility in topographical pattern design for use in varied applications.

Referring to FIG. 7, schematically illustrated therein, in simplified cross-sectional view, is a an illustrative, but not limitative, sequence of steps according to the present invention, for forming a "permanent master" and then forming a stamper/imprinter therefrom for use in recording media patterning.

In an initial step, shown in the uppermost view of FIG. 7, a body of a substantially rigid material is provided, having an upper surface which has been subjected to planarization processing, e.g., chemical-mechanical polishing (CMP), to form a substantially flat surface in which the topographical pattern is to be formed. According to the invention, suitable substantially rigid, mechanically robust, planarizable materials include silicon wafers, glasses, ceramics, and glass-ceramic composites. In the next several steps according to the inventive methodology, a layer of a conventional resist material of appropriate thickness, e.g., a positive or negative photoresist, is formed on the planarized upper surface of the substrate, as by any convenient, conventional technique, such as spin coating, followed by recording of a pattern in the layer of resist which corresponds to the topographical pattern to be formed in the planarized upper surface of the substrate. Pattern recording in the resist layer may be accomplished by any suitable conventional technique, e.g., optical photolithography, e-beam exposure, laser irradiation, x-ray or ion beam exposure etc. The pattern recorded in the resist layer is then developed, as by any suitable technique, e.g., selective solvent-initiated dissolution of exposed or unexposed areas, to form a patterned etching mask comprising a plurality of openings exposing selective portions of the upper surface of the substrate corresponding to the topographical pattern to be formed therein.

The substrate with patterned etching mask formed thereon is then subjected to a suitable conventional selective etching process, determined by the particular resist and substrate materials and typically selected from among wet chemical etching and dry etching, such as sputter etching, ion beam etching, and plasma etching, to replicate the pattern of openings in the etching mask in the upper surface of the substrate. In contradistinction to the methodology utilized for forming topographical patterns in resist layers of conventional "masters" for stampers/imprinters, the inventive methodology imposes no restriction on the depth of the topographical features formed in the surface of the substrate for the "permanent master". According to the invention, a variety of topographical patterns may be formed in the substrate surface, depending upon the particular patterning method and recording media type. Stampers/imprinters fabricated according to the invention which are intended to be utilized for forming servo patterns in magnetic recording media typically include feature dimensions as described supra in the description of the background art.

Following pattern definition in the upper surface of the substrate, the remaining etch mask layer of resist material is selectively removed therefrom via any convenient technique, e.g., plasma ashing. The resultant substrate with topographically patterned upper surface is termed a "permanent master".

Subsequent processing to form a plurality of stampers/imprinters from the "permanent master" proceeds analogously to the processing steps associated with stamper/imprinter manufacture utilizing conventional resist-based "masters". More specifically, a thin layer of an electrically conductive material is initially formed on the surface of the "permanent master" having the topographical pattern formed therein, followed by forming a suitably thick blanket layer of an electrically conductive material on the thin layer for providing sufficient mechanical rigidity of the resultant stamper/imprinter, wherein the blanket layer over-fills each of the plurality of recesses comprising the topographical pattern and includes an "overburden" portion extending over each non-recessed area.

According to embodiments of the invention, the thin layer of an electrically conductive material is formed on the topographical patterned surface of the "permanent master" by a suitable thin film deposition process selected from electroless plating, physical vapor deposition (PVD), and chemical vapor deposition (CVD), with sputtering (a PVD technique) being preferred. The blanket layer of electrically conductive material, e.g., a metal or metal alloy, may be conveniently formed on the thin layer of electrically conductive material by means of an electrochemical deposition process, e.g., electroforming, wherein the thin layer of electrically conductive material serves as an electrical contact.

In the event stampers/imprinters intended for use in contact printing of magnetic recording media are to be formed from the "permanent master", at least the blanket layer must be formed of a layer of a magnetic material having high saturation magnetization $B_{sat} \geq$ about 0.5 Tesla, and high permeability $\mu \geq$ about 5, e.g., selected from among Ni, NiFe, CoNiFe, CoSiFe, CoFe, and CoFeV.

According to the next (final) step of the inventive methodology, the blanket layer with a lower (imprinting) surface including a topographical pattern corresponding to that of the "permanent master" is separated therefrom to form a stamper/imprinter. Separation of the blanket layer from the "permanent master" is readily effected in view of the poor adhesion therebetween arising from significantly different properties of the materials of the blanket layer and the "permanent master".

Further according to the invention, the aforementioned blanket layer formation process may advantageously be repeated multiple times with the same "permanent master" to form a plurality of stampers/imprinters with no loss of pattern replication fidelity.

The present invention thus affords a number of significant advantages over previous processes for forming stampers/imprinters utilized for patterning various types of recording media, including, but not limited to, formation of servo patterns in magnetic recording layers, including the ability to form a plurality of stampers/imprinters from a single "permanent master" without compromising pattern replication fidelity, as well as increased freedom in pattern definition, e.g., increased recess depths.

It should be apparent to one of ordinary skill in the art that the present invention provides a significant improvement over the conventional art such as has been described above, particularly with respect to the ease and simplicity of manufacturing a plurality of high replication fidelity stampers/imprinters for use in various types of media patterning processes. Further, the imprinting surface of the stampers/imprinters according to the invention can be formed with a wide variety of topographical patterns, whereby the inventive methodology and apparatus can be rapidly, easily, and cost-effectively implemented in the automated manufacture of a number of articles, devices, etc., requiring patterning, of which servo patterning of longitudinal and perpendicular magnetic recording media merely constitute examples of the versatility and utility of the invention.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of manufacturing a stamper/imprinter for use in patterning of a recording medium, comprising sequential steps of:

(a) providing a permanent master comprising a body of a substantially rigid material having a surface with a topographical pattern formed therein comprising a patterned plurality of spaced-apart recesses with a plurality of non-recessed areas therebetween, said topographical pattern corresponding to a pattern to be formed in a recording medium;

(b) forming a layer of a substantially rigid magnetic material over said surface of said permanent master with said topographical pattern formed therein, wherein said layer of substantially rigid magnetic material has saturation magnetization $B_{sat} \geq$ about 0.5 Tesla, permeability $\mu \geq$ about 5, and is selected from the group consisting of CoSiFe and CoFeV; and (c) separating said layer of a substantially rigid magnetic material from said master, said layer of a substantially rigid magnetic material having an imprinting surface with a topographical pattern formed therein replicating said topographical pattern of said permanent master.

2. The method as in claim 1, wherein:

step (a) comprises providing a permanent master comprising a body of a substantially rigid material capable of undergoing planarization processing to form a substantially flat surface in which said topographical pattern is formed.

3. The method as in claim 2, wherein:

step (a) comprises providing a permanent master comprising a body of a material selected from the group consisting of: silicon, glass, ceramic, and glass-ceramic composites.

4. The method according to claim 1, wherein step (a) comprises sequential sub-steps of:

($a_1$) providing a body of a substantially rigid material having a planarized flat surface in which said topographical pattern is to be formed; said material selected from the group consisting of: silicon, glass, ceramic, and glass-ceramic composites;

($a_2$) forming a layer of a resist material on said surface of said body;

($a_3$) recording a pattern in said layer of resist corresponding to said topographical pattern to be formed in said surface of said body;

($a_4$) developing said pattern in said layer of resist to form a patterned etching mask comprising a plurality of openings exposing portions of said surface of said body corresponding to said topographical pattern to be formed therein;

($a_5$) selectively etching said exposed portions of said surface of said body utilizing said patterned etching mask to form a pattern of recesses in said flat surface of said body, said pattern of recesses corresponding to said topographical pattern; and ($a_6$) removing said patterned etching mask.

5. The method according to claim 1, wherein:

step (b) comprises forming said layer of a substantially rigid magnetic material as a blanket layer over-filling each of said plurality of recesses and including an overburden portion extending over each of said non-recessed areas.

6. The method as in claim 5, wherein step (b) comprises sequential sub-steps of:

($b_1$) forming a thin layer of an electrically conductive material on said surface of said master having said topographical pattern formed therein; and ($b_2$) forming said blanket layer on said thin layer of an electrically conductive material by an electrochemical process.

7. The method as in claim 6, wherein:

step ($b_1$) comprises forming said thin layer of an electrically conductive material on said topographical pattern by means of a thin film deposition process selected from the group consisting of: electroless plating, physical vapor deposition (PVD), and chemical vapor deposition (CVD).

8. The method as in claim 6, wherein:

step ($b_2$) comprises forming said blanket layer on said thin layer of an electrically conductive material by an electroforming process.

9. The method as in claim 1, further comprising:

repeating steps (b) and (c) multiple times with the permanent master provided in step (a) to form a plurality of stampers/imprinters.

10. A method of manufacturing a stamper/imprinter for use in patterning of a recording medium, comprising sequential steps of:

(a) providing a permanent master comprising a body of a substantially rigid material having a surface with a topographical pattern formed therein comprising a patterned plurality of spaced-apart recesses with a plurality of non-recessed areas therebetween, said topographical pattern corresponding to a pattern to be formed in a recording medium, wherein step (a) comprises sequential sub-steps of:

($a_1$) providing a body of a substantially rigid material having a planarized flat surface in which said topographical pattern is to be formed; said material selected from the group consisting of: silicon, glass, ceramic, and glass-ceramic composites;

($a_2$) forming a layer of a resist material on said planarized flat surface;

($a_3$) recording a pattern in said layer of resist corresponding to said topographical pattern to be formed in said surface of said body;

($a_4$) developing said pattern in said layer of resist to form a patterned etching mask comprising a plurality of openings exposing portions of said surface of said body corresponding to said topographical pattern to be formed therein;

($a_5$) selectively etching said exposed portions of said surface of said body utilizing said patterned etching mask to form a pattern of recesses in said flat surface of said body corresponding to said topographical pattern; and ($a_6$) removing said patterned etching mask;

(b) forming a blanket layer of a substantially rigid magnetic material selected from the group consisting of CoSiFe and CoFeV over said surface of said permanent master with said topographical pattern formed therein, said blanket layer over-filling each of said plurality of recesses and including an overburden portion extending over each of said non-recessed areas, wherein step (b) comprises sequential sub-steps of:

($b_1$) forming a thin layer of an electrically conductive material on said surface of said master having said topographical pattern formed therein by means of sputtering; and ($b_2$) forming said blanket layer on said thin layer of an electrically conductive material by an electrochemical process; and (c) separating said layer of a substantially rigid material from said master, said layer of a substantially rigid material having an imprinting surface with a topographical pattern formed therein replicating said topographical pattern of said permanent master.

11. The method as in claim 10, wherein:

step ($b_2$) comprises forming said blanket layer on said thin layer of an electrically conductive material by an electroforming process.

12. The method as in claim 10, further comprising:

repeating steps (b) and (c) multiple times with the permanent master provided in step (a) to form a plurality of stampers/imprinters.

* * * * *